United States Patent [19]
Komatsu

[11] Patent Number: 5,550,675
[45] Date of Patent: Aug. 27, 1996

[54] SEMICONDUCTOR LIGHT RECEIVING APPARATUS

[75] Inventor: Nobuko Komatsu, Tokyo, Japan

[73] Assignee: NEC Corporation, Tokyo, Japan

[21] Appl. No.: 310,743

[22] Filed: Sep. 22, 1994

[30] Foreign Application Priority Data

Sep. 25, 1993 [JP] Japan .................... 5-261691

[51] Int. Cl.⁶ ............ H01L 31/0232; H01L 33/00; H01S 3/18; G02B 7/00
[52] U.S. Cl. ............ 359/514; 359/894; 372/33; 372/36; 372/43; 257/98; 257/99; 257/680
[58] Field of Search ............ 359/513, 514, 359/894; 372/33, 36, 43, 703; 257/82, 98, 99, 680, 711, 100

[56] References Cited

U.S. PATENT DOCUMENTS

| | | | |
|---|---|---|---|
| 4,351,051 | 9/1982 | Van Alem et al. | 372/36 |
| 4,686,678 | 8/1987 | Ohta et al. | 372/703 |
| 4,768,070 | 8/1988 | Takizawa et al. | 372/36 |
| 4,803,689 | 2/1989 | Shibanuma | 372/36 |
| 5,033,052 | 7/1991 | Masuko et al. | 372/36 |
| 5,089,861 | 2/1992 | Tanaka et al. | 372/36 |

FOREIGN PATENT DOCUMENTS 0186044  7/1986  European Pat. Off. .
58-015287  1/1983  Japan .
58-190076  11/1983  Japan .
62-94990  5/1987  Japan .
62-224088  10/1987  Japan .
31-04286  5/1991  Japan .

*Primary Examiner*—Ricky D. Shafer
*Attorney, Agent, or Firm*—Popham, Haik, Schnobrich & Kaufman, Ltd.

[57] ABSTRACT

It is the object of the invention to suppress noises caused by reflections of a ray of light from a light receiving surface of a photodiode chip and inner and outer surfaces of a glass in a semiconductor light receiving apparatus. A construction of a light receiving apparatus is that, a photodiode chip 4 is mounted on a carrier 2 fixed to a stem 1, and a chip 4 is sealed up by a cap 7, which is provided with an opening 7a covered with glass 8. A ray of light transmits through an opening 7a, and incidents on a light receiving surface of a chip 4. A light receiving surface of a chip 4 and an outer surface of a glass 8 are inclined to the optical axis, where directions of inclinations are different to each other. An angle of inclination of a chip 4 is selected such that reflected rays from a chip 4 does not incident on an opening 7a. Accordingly, there is no ray which returns to a light source (not shown), and generation of delayed incidences to a chip 4 can be prevented.

5 Claims, 3 Drawing Sheets

5,550,675

SEMICONDUCTOR LIGHT RECEIVING APPARATUS

FIELD OF THE INVENTION

The invention relates to a semiconductor light receiving apparatus, and more particularly, to a semiconductor light receiving apparatus used for optical communications and optical measurements, which prevents reflections of incident light on its way to a semiconductor photodiode chip.

BACKGROUND OF THE INVENTION

A semiconductor light receiving apparatus plays important roles in fields of optical communications and measurements as a photoelectric converting apparatus. A typical construction of a conventional semiconductor light receiving apparatus is that, a photodiode chip such as PIN-photodiode is mounted on a carrier, which is fixed to a stem as one body, and a cap seals up these elements and is fixed to a stem. A cap has a flattened top and is provided with an opening at a center of a top. This is covered with a plate formed glass. In most cases, outer and inner surfaces of a glass and a light receiving surface are parallel to each other, and an input ray of light incidents normally to these surfaces.

In this construction, a portion of a ray is reflected at both surfaces of a plate formed glass and a light receiving of a photodiode chip. Consequently, a portion of an input ray returns to a light source. Moreover, when multiple reflections of a ray along a light path cannot be neglected, other portions of the input ray become delayed incidences to the light receiving surface of the chip. These phenomena cause noise on the output signal of the semiconductor light receiving apparatus.

SUMMARY OF THE INVENTION

Accordingly, it is an object of the invention to provide a semiconductor light receiving apparatus which is free of noises caused by reflections of rays of light from the light receiving surface of the photodiode chip and outer and inner surfaces of the glass.

According to the object of the invention, a semiconductor light receiving apparatus comprises:

a stem, a photodiode chip (a chip, hereinafter), and a cap which seals up and inner space and is provided with an opening covered with a plate formed transparent material, wherein the chip is mounted on the stem and sealed up by the cap, the light receiving apparatus comprising:

the chip which has a light receiving surface inclined to an optical axis, and the plate formed transparent material which has an outer surface inclined to the optical axis.

BRIEF DESCRIPTION OF THE DRAWINGS

The invention will be explained in more detail in conjunction with appended drawings, wherein.

DESCRIPTION OF THE PREFERRED EMBODIMENTS

Figure 1:
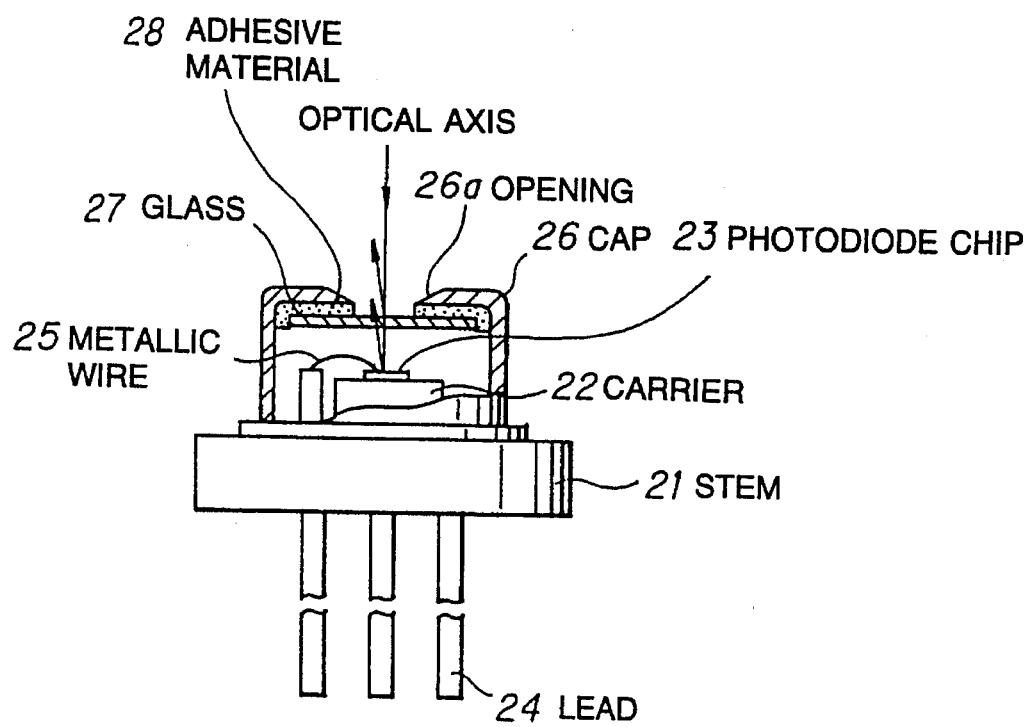
FIGS. 1 shows a cross-sectional view of a conventional semiconductor light receiving apparatus.
Figure 2:
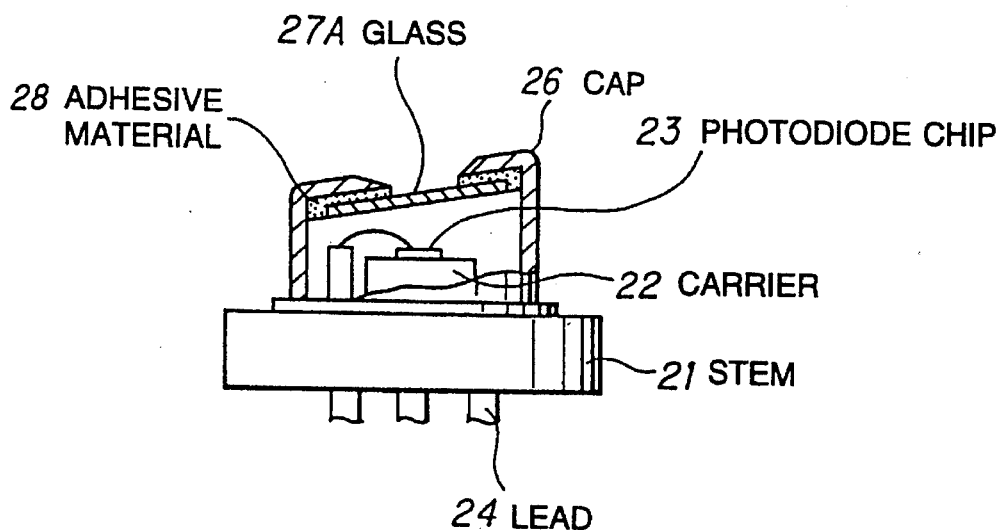
FIG. 2 shows a cross-sectional view of an improved conventional semiconductor light receiving apparatus.

Before explaining a semiconductor light receiving apparatus in the preferred embodiments according to the invention, the aforementioned conventional semiconductor light receiving apparatus will be explained referring to FIGS. 1 to 3.

As an example of such a conventional semiconductor light receiving apparatus, we can cite the one which mounts a photodiode chip such as a photodiode in a vessel formed package. For instance, in an apparatus shown in FIG. 1, a carrier 22 is put on an upper surface of a stem 21 as one body, a photodiode chip 23 is mounted on a carrier 22, and the chip is electrically connected to a lead 24, which is fixed to the stem 21, by a metallic wire 25. An upper surface of the stem 21 is covered with a cap 26, which seals up the chip and etc.. The upper surface of a cap 26 is provided with an opening 26a, to which a plate formed transparent material, a glass 27 in this case, is fitted by adhesive material 28. A glass 27 is a portion of an optical path, and seals up an inner space of a cap 26. In the semiconductor light receiving apparatus, an incident ray of light passes through a glass 27 and received by a photodiode chip 23, wherein a electrical signal can be derived by photoelectric conversion.

In this construction, however, a path of an incident ray of light, in other words, an optical axis, is perpendicular to the light receiving surface of the photodiode chip 23 and also to two parallel surfaces of the glass 27. Accordingly, the reflected rays of light from outer and inner surfaces of the glass 27, or the light receiving surface of the photodiode chip 23 return to a light source tracing the incident paths, and a part of the incident ray of light may possibly become delayed incidences on account of multiple reflections along the optical path.

In such a situation, the oscillation of the laser-diode is perturbed in the light source, and the operation of the photoelectric converting element is disturbed, which can cause noise.

Consequently, several countermeasures to meet these problems have been proposed. For example, in a conventional construction shown in FIG. 2, the glass 27 is inclined to the optical axis, and in that shown in FIG. 3, the glass 27 has a tapered cross-section. In the construction shown in FIG. 2, directions of reflected rays of light from the outer and inner surfaces of the inclined glass 27 deviate from the optical axis, and therefore returns of rays to the light source (not shown), or delayed incidence of rays to the photodiode can be prevented.

Figure 3:
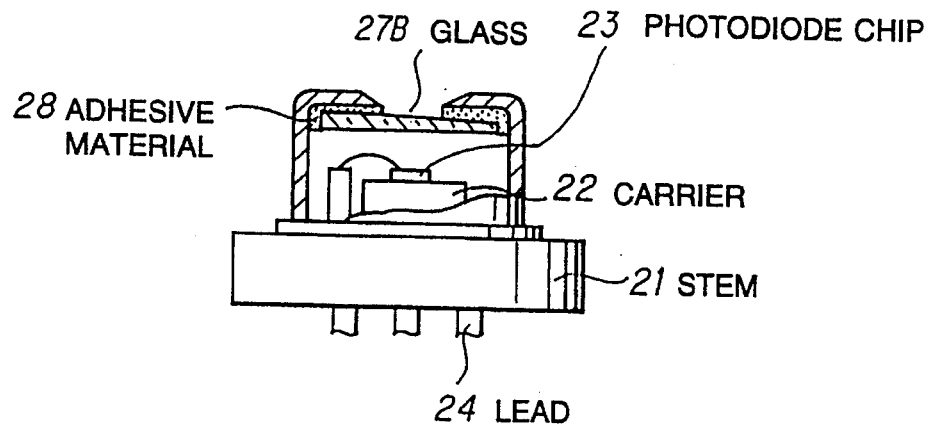
FIG. 3 shows a cross-sectional view of another improved conventional semiconductor light receiving apparatus.

In the construction shown in FIG. 3, which appeared in Japanese Patent Kokai No. 3-104286, reflected rays from outer and inner surfaces of the glass 27B point to directions other than that of the incident ray of light, and thereby returns to the light source of reflected rays and delayed incidences to the photodiode chip 23 can be considerably decreased.

In constructions shown in FIGS. 2 and 3, however, the optical axis is perpendicular to the light receiving surface of the photodiode chip 23, and consequently there are several problems described as follows. In the construction shown in FIG. 2, a parallel plate glass 27 is used, and therefore it is possible to shift the paths of reflected rays of light from the optical axis, however, the reflected rays from a portion of the light receiving plane of the photodiode chip 23 return to the light source passing along the path, which is shifted from the optical axis, or incident again upon the other portion of the light receiving plane as delayed signals, and it is difficult to surely solve problems. In the construction shown in FIG. 3, the optical axis is perpendicular to one of surfaces (an inner surface, in this case) of the glass 27B with a tapered cross-section, and thereby this inner surface and the light receiving surface of the chip 23 are parallel to each other, and therefore the multiple reflections between these surfaces cannot be avoided, and it is difficult to certainly solve aforementioned problems.

The light receiving apparatus according to the invention is constructed such that, a photodiode chip receives a light signal through a transparent material which seals up an opening cut on an upper surface of a cap, a light receiving surface of a photodiode chip is inclined to an optical axis, and outer surface of a transparent material is inclined to the optical axis.

An inclination angle of a receiving surface of a chip on a photodiode is selected such that, an incident ray of light from a direction of an optical axis to a light receiving surface of a photodiode chip is reflected to an area other than an opening on a cap. Moreover, it is desirable that, a direction of inclination of an outer surface of a transparent material is opposed to a direction of an inclination of a light receiving surface of a photodiode chip.

Since the light receiving surface of the photodiode chip is inclined to the optical axis, a ray of light, which incidents upon the light receiving surface of the chip, is reflected to a zone, which is off the opening on the cap, and there are no afraid of return of rays to the optical source and delayed incidence of light rays on the light receiving surface of the chip. Moreover, since inclinations of the outer surface of the transparent plate and the light receiving surface of the chip are opposite to each other, a light ray incident upon the light receiving surface is reflected in a direction, which further deviates from the direction of the optical axis, and thereby effectiveness of an inclination of the chip is promoted.

Figure 4:
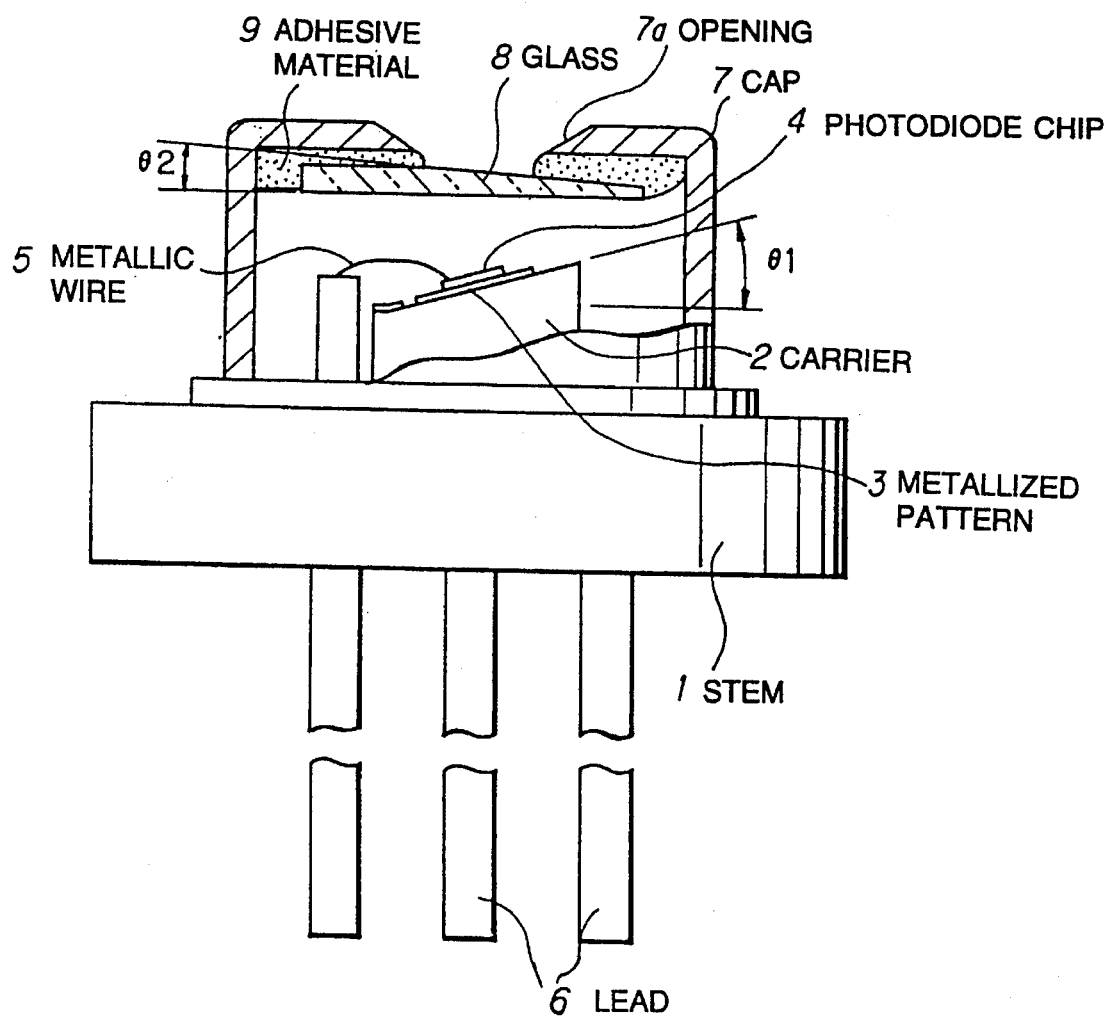
FIG. 4 shows a cross-sectional view which represents a construction of a semiconductor light receiving apparatus according to the invention as a first preferred embodiment.

Next, the preferred embodiments according to the invention will be explained. FIG. 4 is a cross-sectional view which shows a semiconductor light receiving apparatus according to the invention, as the first preferred embodiment of the invention. A carrier 2 is fixed to an upper surface of a stem 1 as one body. An upper surface of the carrier 2 is inclined to an upper surface of the stem 1 with an angle of θ₁, and thereon a predetermined metallized pattern 3 is made up. A photodiode chip 4, such as PIN-photodiode and etc., is mounted on the inclined portion of the patterned portion 3, and the chip of the patterned portion 3, and the photodiode chip 4 and the lead 6 are electrically connected to each other by a metallic wire 5. The upper surface of the stem 1 is covered by a cap 7, which seals up the photodiode chip 4 and etc. The upper surface of the cap 7 is provided with an opening 7a, to which a plate formed transparent material (a plate formed glass, in this case) 8 is fixed using adhesive material 9. The incident ray of light passes through the glass 8, which seals up the inner space of the cap 7. The glass 8 is not a parallel plate glass, but has a tapered formed cross section. The inner surface of the glass 8 is orthogonal to the optical axis, however, the outer surface of the glass 8 is inclined to the inner surface with the prescribed angle of θ₂, and directions of inclination of the outer surface of the glass 8 and the light receiving surface of the chip 4, which is mounted on the inclined surface of the carrier 2, are opposite to each other.

Figure 5:
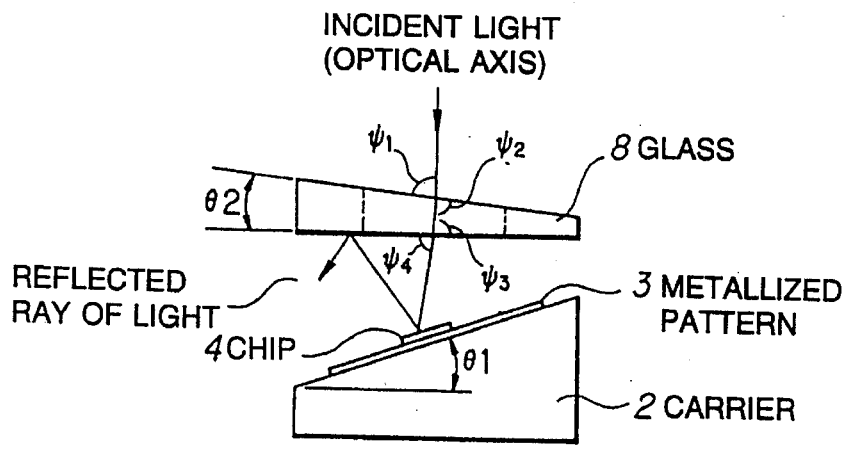
FIG. 5 is a typical drawing which shows the essential part of the apparatus shown in FIG. 1.

According to this construction, as seen from the locus of the ray of light shown in FIG. 5, an incident ray of light from a light source outside of this drawing, passing through the glass 8 covering the opening 7a on the cap 7, is refracted in the direction, which is different from the optical axis, and incidents on the light receiving surface of the chip 4, because the cross section of the glass 8 has a tapered form. At this time, a portion of the ray of light is reflected at outer and inner surface of the glass 8, however, the reflected ray of light is directed in the direction which is different from the optical axis, because the outer surface is inclined to the optical axis. The ray of light, which incidents on the inner surface, has been already refracted at the outer surface, is pointed to the direction which is different from the optical axis. Accordingly, returns of rays to the light source can be prevented.

Since the light receiving surface of the chip 4 is inclined to the optical axis, the ray of light, which incidents on the light receiving surface of the chip 4, is reflected in a direction which largely deviates from the optical axis. Consequently, a reflected ray from the light receiving surface of the chip 4 does not incident on the opening 7a on the cap 7, and therefore there is no possibility of return of a ray to a light source. At the inner surface of the glass 8, a part of the ray is reflected towards the opening 7a, however, when passing through and leaving the glass 8, the ray is refracted in the direction which deviates further from the optical axis, because of the tapered form of the cross section of the glass 8.

Accordingly, perturbations to the light source and disturbances to the photodiode can be prevented, and noises can be effectively suppressed.

Next, the angle of inclination θ₁ of the light receiving surface of the chip 4 and the angle of inclination θ₂ of the outer surface of the glass 8 will be studied. First of all, let us tentatively consider the case in which the outer and inner surfaces of the glass 8 are parallel to each other.

Figure 6:
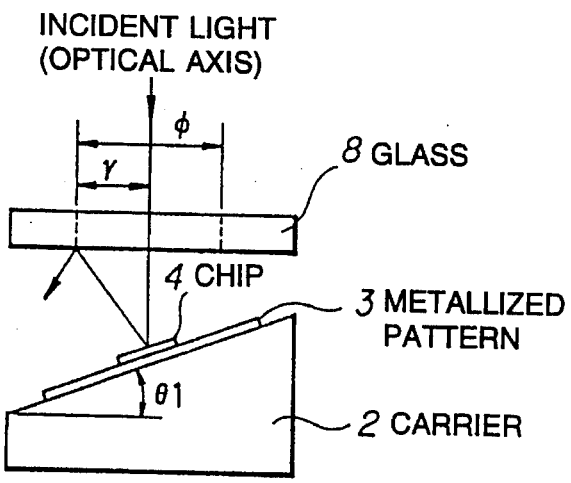
FIG. 6 is a typical drawing for explanation of the angle of inclination of the photodiode chip.

FIG. 6 is a typical drawing for such a case. Let the distance from the light receiving surface of the chip 4 to the inner surface of the glass 8 be 1. The effective diameter and the radius of the glass 8, in other words the inner diameter and the radius of the opening 7a on the cap 7 are denoted by $\phi$ and $\gamma$ respectively. The condition that the reflected ray of light does not return to the effective area of the glass 8, in other words the reflected ray does not propagate into the outer space passing through the opening 7a on the cap 7 is that the angle of the inclination θ₁ of the chip 4 satisfies a following inequality.

$$\gamma > 1 \cdot \tan 2\theta_1 \qquad (1)$$

Therefore, $$\tan 2\theta_1 < \gamma/1 + tm \qquad (2)$$

In this embodiment, the effective diameter of the glass 8 is $\phi=1$ mm ($\gamma=0.5$ mm), the distance $1=0.68$ mm. On solving Eq. (2) based upon these numerical values, we get $\theta_1 > 18.3°$.

It is a purpose of inclinating the outer surface of the glass 8 by the angle of θ₂ to make the reflected ray deviate from the optical axis and to suppress the multiple reflections, and therefore there is no necessity to make $\theta_2$ be large. We should be more careful to get effective results in assembling process of a chip and other parts within tolerance limits.

As shown in FIG. 5, Snell's law holds between incident and refracted rays, as shown in the following equation.

$$n_{in} \cos\psi_{in} = n_{out} \cos\psi_{out} \qquad (3)$$

Wherein $n_{in}$ and $n_{out}$ is refractive indexes of mediums before and after refraction respectively. Refractive indexes of air and glass are 1 and 1.5 respectively. $\psi_{in}$ is the supplementary angle of the angle of incidence and $\psi_{out}$ is the supplementary angle of an angle of refraction.

For example, if we let the angle of the inclination of the outer surface of the glass 8 be $\theta_2 = 5°$ in FIG. 5, $\psi_1$, a supplementary angle of the angle of incidence of the ray incidenting along the optical axis, is equal to the supplementary angle of $\theta_2$, and therefore $\psi_1 = 85°$. On using the equation (3), we can get the values of the angles $\psi_2$, $\psi_3$ and $\psi_4$ in FIG. 5 as follows.

$\psi_2 = 86.7°$, $\psi_3 = 88.3°$, $\psi_4 = 87.5°$

Consequently, the ray incidents on the photodiode chip 4 at the angle of 2.5° with respect to the optical axis.

Consequently, if we take into consideration the value of this angle, the effective light receiving are ($\phi = 80$ μm) of the photodiode chip 4 and the above mentioned value of $\theta_1 > 18.3°$, we can conclude that the safety zone is given by $\theta_1 > 20°$, even on the worst path of a ray considered on FIG. 5, and the noises caused by the reflection can be effectively suppressed.

Figure 7:
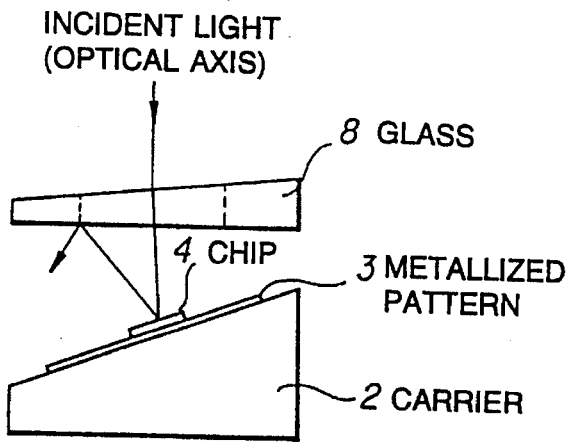
FIG. 7 is a typical drawing which shows the essential part of another embodiment of the invention.

As shown in FIG. 7, directions of inclinations of the light receiving surface of the chip and the outer surface of the glass 8 may be the same. In this case, the direction of refraction in the glass and that of reflection at the light receiving surface of the chip are opposite to each other, and therefore a portion of reflected ray is directed to the light source, and the effect of suppressing delayed incidences to the light receiving surface is decreased to some extent. However, this configuration is effective, when the incident ray of light is nearly perpendicular to the light receiving surface of the chip.

It is possible to incline not only the outer surface of the glass but also both inner and outer surfaces, which is not shown schematically.

Incidentally, in the conventional construction, the reflection attenuation is 30 dB at first, but this value is improved to about 45 dB by adjusting the inclination of the chip, and is further improved to more than 50 dB by adjusting the inclination of the outer surface of the glass too.

As described in the above, the light receiving surface of the chip and the outer surfaces of the transparent material are inclined to the optical axis in the invention, the incident ray along the optical axis to the light receiving surface of the chip does not return to the light source, and the delayed incidence to the light receiving surface of the chip caused by multiple reflections can be prevented. Accordingly, noise generation is effectively suppressed, and the light receiving apparatus with high quality can be obtained.

Especially, the angle of inclination of the light receiving surface of the chip is selected such that, the reflected ray from the light receiving surface of the chip is directed the area outside of the opening on the cap, and therefore return of the above mentioned reflected ray to the optical source can be certainly prevented.

Moreover, since the inclinations of the outer surface of the transparent material and the light receiving surface of the chip are opposite to each other, the direction of the incident ray to the light receiving surface is different for the direction of the optical axis, which increases the effect of the inclination of the chip of the light receiving surface.

Although the invention has been described with respect to specific embodiment for complete and clear disclosure, the appended claims are not to be thus limited but are to be construed as embodying all modifications and alternative constructions that may occur to one skilled in the art which fairly fall within the basic teachings herein set forth.

What is claimed is

1. A semiconductor light receiving apparatus, comprising:

a light receiving chip mounted on a carrier and having a light axis;

a cap for containing the chip and having an opening on the light axis;

a transparent plate for transmitting light along the light axis, the transparent plate being sealingly fixed to the cap to close the cap's opening; and a stem for sealingly placing the cap thereon, to enclose the chip;

wherein:

a light receiving surface of the chip is inclined in a first direction to the light axis; and an outer surface of the transparent plate is inclined in a second direction to the light axis, which second direction is opposite to the first direction.

2. The apparatus of claim 1, wherein:

an inclination angle of the transparent plate's outer surface is smaller than an inclination angle of the chip's light receiving surface.

3. The apparatus of claim 1, wherein:

an inclination angle of the chip's light receiving surface is determined such that reflected light from the light receiving surface is not incident on the cap's opening.

4. A semiconductor light receiving apparatus, comprising:

a light receiving chip mounted on a carrier and having a light axis;

a cap for containing the chip and having an opening on the light axis;

a transparent plate for transmitting light along the light axis, the transparent plate being sealingly fixed to the cap to close the cap's opening; and a stem for sealingly placing the cap thereon to enclose the chip;

wherein:

a light receiving surface of the chip is inclined in a first direction to the light axis;

an outer surface of the transparent plate is inclined in a second direction to the light axis, which second direction is opposite to the first direction;

an inclination angle of the transparent plate's outer surface is smaller than an inclination angle of the chip's light receiving surface; and the chip's light receiving surface inclination angle is determined such that light reflected from the light receiving surface is not incident on the cap's opening.

5. A semiconductor light receiving apparatus, comprising:

a light receiving chip mounted on a carrier and having a light axis;

a cap for containing the chip and having an opening on the light axis;

a transparent plate for transmitting light along the light axis, the transparent plate being sealingly fixed to the cap to close the cap's opening; and a stem for sealingly placing the cap thereon to enclose the chip;

wherein:

a light receiving surface of the chip is inclined in a first direction to the light axis with an inclination angle which is determined such that reflected light from the light receiving surface is not incident on the cap's opening;

an outer surface of the transparent plate is inclined in a second direction to the light axis; and said first direction is opposite to said second direction.

* * * * *